United States Patent [19]
Pruehs

[11] Patent Number: 5,620,337
[45] Date of Patent: Apr. 15, 1997

[54] FUSED WATTHOUR METER BYPASS STORAGE ADAPTER

[75] Inventor: Allen V. Pruehs, Howell, Mich.

[73] Assignee: Ekstrom Industries, Inc., Farmington Hills, Mich.

[21] Appl. No.: 404,722

[22] Filed: Mar. 15, 1995

[51] Int. Cl.⁶ .................................................. H01R 31/08
[52] U.S. Cl. .......................................... 439/508; 361/662
[58] Field of Search ..................................... 439/146, 167, 439/508, 517, 621; 361/661, 662, 668

[56] References Cited

U.S. PATENT DOCUMENTS

| | | | |
|---|---|---|---|
| 2,606,232 | 8/1952 | St. John | 361/661 |
| 3,029,322 | 4/1962 | Waldrop | 361/662 |
| 3,035,242 | 5/1962 | Sloop | 439/508 |
| 3,806,857 | 4/1974 | Hubeny | 361/662 |
| 4,203,645 | 5/1980 | Shennett, Jr. | 439/621 |
| 4,323,294 | 4/1982 | Robinson | 439/508 |
| 5,033,973 | 7/1991 | Pruehs et al. | 439/167 |

OTHER PUBLICATIONS

Ekstrom Meter Socket Jumper Covers, Bulletin 9927, May 1, 1980.

*Primary Examiner*—Neil Abrams
*Attorney, Agent, or Firm*—Young & Basile, PC.

[57] ABSTRACT

A watthour meter socket adapter includes a housing with a base (12) and an annular sidewall for receiving a watthour meter. Pairs of line blade terminals (69, 64) and load blade terminals (50, 52) extend through the base for connection to jaw contacts in a watthour meter socket. The line blade terminals have a fuse mounting end disposed within the housing. A fuse connector is attached to the load blade terminals and includes a fuse mounting end. The fuse mounting ends include threaded studs (70, 86, 88) and are arranged in the housing to receive two fuses (92, 94) in selectible positions between the line and load blade terminals and between both load blade terminals with apertured tabs (96, 98) of the fuses fitted over the studs. A pair of jaw contacts are mounted in the housing and disconnected from the line blade terminals to temporarily mount a watthour meter on the housing in a storage position.

21 Claims, 4 Drawing Sheets

FUSED WATTHOUR METER BYPASS STORAGE ADAPTER

BACKGROUND OF THE INVENTION

1. Field of the Invention

The present invention relates, in general, to electrical watthour meters and, specifically, to watthour meter socket adapters and, more specifically, to jumper apparatus insertable into a meter socket for bypassing the watthour meter.

2. Description of the Art

In the electric utility industry, watthour meters are employed to measure electrical power consumption at a residential or commercial building site. A cabinet is physically mounted on the outside wall of the residence or building and contains a meter socket having pairs of lines and load terminals which are connected to electric power line conductors extending from the utility power network and electric load conductors connected to the residential or building power distribution network. The socket terminals are typically in the form of jaw contacts which receive the blade terminals extending outward from the base of a watthour meter in a snap-in connection to complete an electric circuit through the watthour meter between the line and load terminals mounted in the socket for the measurement of electrical power consumption.

Occasionally, one of the line terminals or jaw contacts in the meter socket burns out thereby disconnecting electric power to one side of the electrical power service. However, the other line terminal or jaw contact is usually still in operable condition and is capable of providing power to at least a portion of the load distribution network.

In order to enable electric power to be continued to be supplied to the residential or building site, even at a reduced level, and before the jaw contact or entire meter socket is repaired or replaced, electric utilities have frequently connected temporary jumpers between the still operable line jaw contact and one or both of the load contacts in the meter socket. Since the installation of separate jumper wires in a live meter socket poses a substantial safety risk, various devices have been devised which provide the desired jumper connection between one line contact and one or both of the load contacts in the meter socket in a simple, safe, plug-in manner.

For example, a meter socket jumper cover shown in FIG. 1 has been sold by Ekstrom Industries, Inc., the assignee of the subject invention. This meter socket jumper cover is in the form of an annular plastic disk having a handle mounted on an exterior side and at least one jumper mounted on the rear side. The jumper is in the form of an electrically conductive plate having at least one blade terminal formed thereon which is insertable into one of the line and load jaw contacts in the meter socket. One model of the jumper cover shown in FIG. 1 includes three blade terminals to provide a jumper between one line contact and two load contacts. This model provides power from one still operable line contact to both load contacts. A mirror image version is also available. Further, a third version includes two jumper strips, each extending from one line contact to one load contact.

Another previous attempt to provide a temporary bypass of a watthour meter to connect power to a load distribution network is shown in FIG. 2. A conventional watthour meter socket adapter includes a housing formed of an annular sidewall and a base and provided with a pair of load jaw contacts disposed within the housing and which extend to a blade terminal end, not shown, extending exteriorly of the housing and insertable into the load contacts in the meter socket. A jumper plate extends between and is connected to the two load jaw contacts as shown in the hidden lines in FIG. 2. A pair of apertures are formed in the socket adapter base at the standard low line contact positions and receive a blade terminal mounted at one end of a flexible conductor, the other end of which is connected to the jumper plate connected between the load jaw contacts in the socket adapter housing. The blade terminal may be inserted through either of the apertures in the base of the housing for connection to the still operable line jaw contact in the meter socket.

Another attempt to provide a watthour temporary watthour meter bypass is shown in FIG. 3. This device takes the form of a conventional watthour meter socket adapter base which has a handle, not shown, mounted on a cover attached to the base. Pairs of line and load blade terminals are mounted on and extend through the base and are insertable into respective line and load jaw contacts in the watthour meter socket. Pairs of fuse clips are mounted on the back surface of the cover and extend through an aperture formed in the base. Each fuse clip of each pair of fuse clips is connected to one of the blade terminals. Thus, a first pair of fuse clips are connected to one line and one load blade terminal, respectively. Another pair of fuse clips are connected to the opposite line and load blade terminals. A third pair of fuse clips are connected to each of the load terminals and to one of the fuse clips of the pair of fused clips connected to the line terminals. This arrangement provides three positions for the insertion of two standard 60 amp fuses which provide both overcurrent protection and a jumper connection between one of the line blade terminals and one or both of the load blade terminals.

However, while the above-described meter bypass jumper apparatus shown in FIGS. 1–3 provide a temporary bypass of a watthour meter in the event of a failure of one of the line contacts in a meter socket, such devices are not without their deficiencies. The prior art meter socket jumper cover shown in FIG. 1 requires separate versions to provide a connection between either of the still operable line contact and one or both of the load contacts. The meter socket jumper cover shown in FIG. 1 as well as the meter bypass apparatus shown in FIG. 2 lack fuses which would add a significant overcurrent safety feature to the use of such meter bypass jumper apparatus. While the meter bypass apparatus shown in FIG. 3 utilizes fuses for overcurrent safety, this apparatus is only capable of receiving low current fuses which thereby limits the amount of power which can be provided to the load distribution network on a temporary basis.

All of the above-described prior art watthour meter bypass jumper apparatus also lack any means for temporarily but securely storing a watthour meter on the apparatus when the jumper or bypass features are being utilized. According to electric utility standards, whenever a watthour meter is removed from a meter socket, it must be recalibrated for proper operation before it can be reinstalled into a watthour meter socket. Such recalibration of a removed watthour meter would not be necessary if the watthour meter could be mounted in an inoperable position on the meter socket while the meter bypass jumper features of the apparatus is being utilized.

While the socket adapter shown in FIG. 2 can receive a meter in the load jaws, such mounting is not secure unless a sealing ring is connected about the mounting flanges of the meter and the socket adapter. Prior to mounting the sealing ring, the meter can tip down.

Thus, it would be desirable to provide a watthour meter bypass adapter which temporarily bypasses a watthour meter to provide at least limited power to a load distribution network. It would also be desirable to provide a watthour meter bypass adapter which is usable regardless of which watthour meter socket line contact is inoperable. It would also be desirable to provide a watthour meter bypass adapter which has the capability of selectively connecting either line contact to either or both load contacts. It would also be desirable to provide a watthour meter bypass adapter which is capable of receiving high amperage fuses to provide a maximum amount of power to a load distribution network. Finally, it would be desirable to provide a watthour meter bypass adapter which has provisions for mounting a watthour meter in a storage position on the adapter during use of the watthour meter bypass features of the adapter.

SUMMARY OF THE INVENTION

The present invention is a fused watthour meter bypass storage adapter which is insertable into a watthour meter socket to provide temporary power to at least one side of an electrical power service in the event of failure of one of the line contacts in the watthour meter socket.

The present socket adapter includes a housing formed of a base and a watthour meter receiving portion. A pair of apertures are formed in the base at standard line terminal mounting positions. Another pair of apertures are formed in the base at standard load terminal mounting positions. A pair of blade terminals are extendable through the pair of apertures at the standard load terminal mounting position. At least one line blade terminal is mounted in one of the pair of apertures in the base at the standard line terminal positions and has a blade terminal end extending through the aperture which is insertable into a line jaw contact in the watthour meter socket.

A first fuse connector means is disposed in the housing and connected to one of the line blade terminals. A second fuse connector means is also disposed in the housing and has a fuse mounting portion and a portion attached to one of the load blade terminals. A fuse having apertures at opposite ends is mountable in one of a plurality of selectible positions on the first and second fuse connector means to connect one line blade terminal to one load blade terminal, to connect the other line blade terminal to the other load blade terminal and/or to connect both load blade terminals together in electrical connections.

Preferably, the line blade terminals include an integrally formed fuse mounting portion and a blade terminal end extendible through one of the apertures in the base of the housing for insertion into a watthour meter socket jaw contact. Preferably, the blade terminal end and the fuse mounting portion are disposed substantially 90° apart.

The second fuse connector means preferably comprises a one piece electrically conductive member having first and second angularly disposed legs. The first leg is attachable to one of the load blade terminals. Preferably, fastener means are extendible through an aperture in the one of the legs and a corresponding aperture in one of the load blade terminals to attach the conductive member to the load blade terminal.

Means are provided for securely mounting a fuse on each fuse mounting portion of the first and second fuse connector means. The mounting means preferably comprises a threaded stud fixedly mounted on and extending outward from each fuse mounting portion. A fastener is threadingly engageable with each stud for securing one end of a fuse to the fuse mounting portion of each fuse connector means.

In a preferred embodiment, the second connector means is provided with two offset studs so as to receive one end of a fuse which is connected at an opposed end to one of the line blade terminals as well as another fuse which is connected at an opposite end to the other load blade terminal.

According to a unique feature of the present socket adapter, a pair of jaw contacts are mounted in the housing at standard line contact positions for receiving the blade terminals of a watthour meter therein to mount the watthour meter in the socket adapter. The jaw contacts in the socket adapter are disconnected from the corresponding line blade terminals extending through the base of the housing of the socket adapter.

With the first and second fuse connector means attached to each line blade terminal and each load blade terminal, two separate fuses may be mounted in the socket adapter in two of three possible mounting positions to selectively provide a power supply circuit from one line blade terminal to one load blade terminal, from the other line blade terminal to the other load blade terminal, or between the two load blade terminals. In this manner, the socket adapter of the present invention may be employed in a watthour meter socket regardless of which line contact in the socket is inoperable to provide at least limited power from the other line blade terminal to one or both load blade terminals connected to a load power distribution network.

The fused watthour meter bypass storage adapter of the present invention provides significant advantages over previously devised meter bypass jumper apparatus. The present bypass adapter is mountable in a meter socket to provide temporary power to one or both sides of a load power distribution network regardless of which line contact in the socket is inoperable. The fuse connector means employed in the socket adapter of the present invention is designed to receive high amperage fuses, such as 110 amp class T type fuses, thereby providing higher levels of power to the load distribution network as compared to previous meter bypass apparatus which typically were capable of utilizing only maximum 60 amp. fuses.

The fused watthour meter bypass storage adapter of the present invention provides increased safety through the use of fuses which also provide the necessary jumper connections between the line and load blade terminals of the adapter. More significantly, the adapter of the present invention provides the desired meter bypass function while enabling the watthour meter which was removed from the meter socket to be temporarily, but securely stored in position on the socket adapter mounted in the meter socket. This eliminates the need to retest or recalibrate the watthour meter prior to insertion of the watthour meter back into the meter socket after the meter socket has been repaired.

BRIEF DESCRIPTION OF THE DRAWINGS

The various features, advantages and other uses of the present invention will become more apparent by referring to the following detailed description and drawing in which.

DESCRIPTION OF THE PREFERRED EMBODIMENTS

Figure 1:
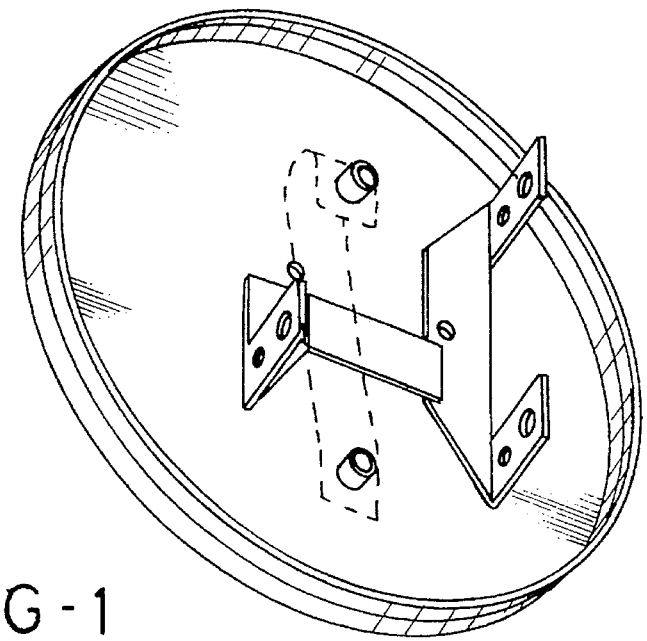
FIG. 1 is a rear perspective view of a prior art meter socket jumper cover.
Figure 2:
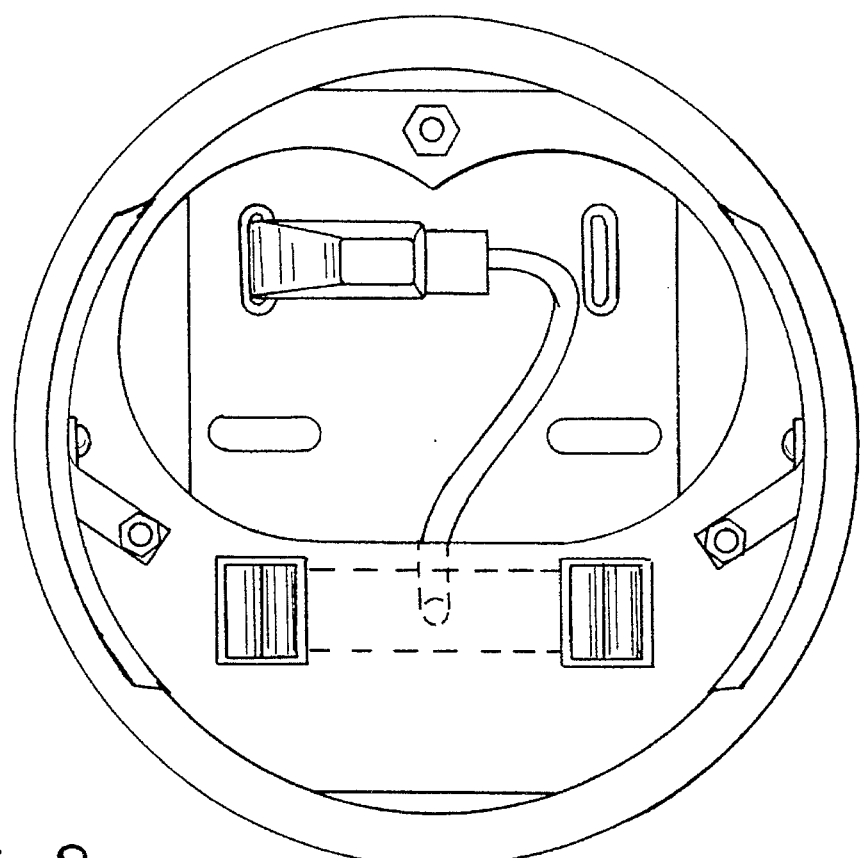
FIG. 2 is a front elevational view of another prior art socket adapter with meter bypass capability.
Figure 3:
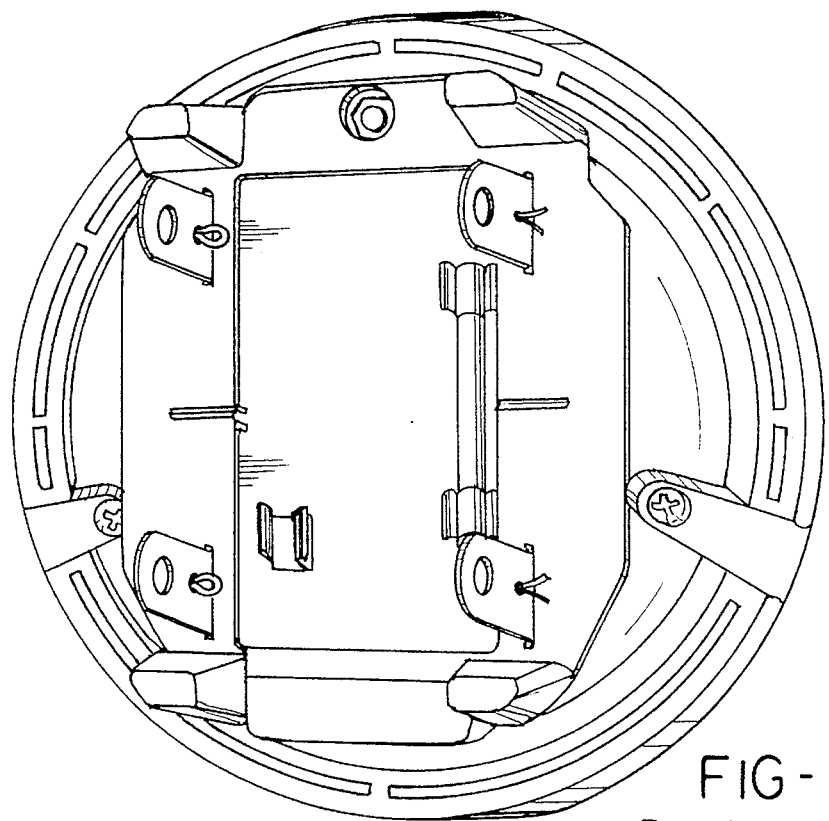
FIG. 3 is a rear perspective view of another prior art fused meter bypass cover.

Referring now to the drawing, and to FIGS. 4–8 in particular, there is depicted a fused watthour meter bypass storage adapter 10 which provides temporary watthour meter bypass capability and the supply of electric power to one or both sides of a load distribution network.

Figure 6:
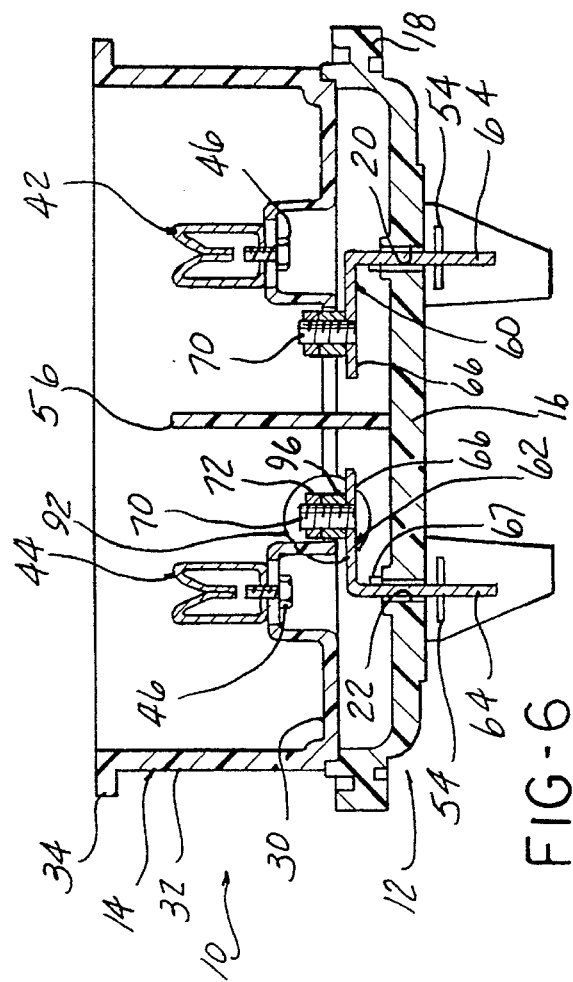
FIG. 6 is a cross-sectional view generally taken along line 6—6 in FIG. 4.
Figure 7:
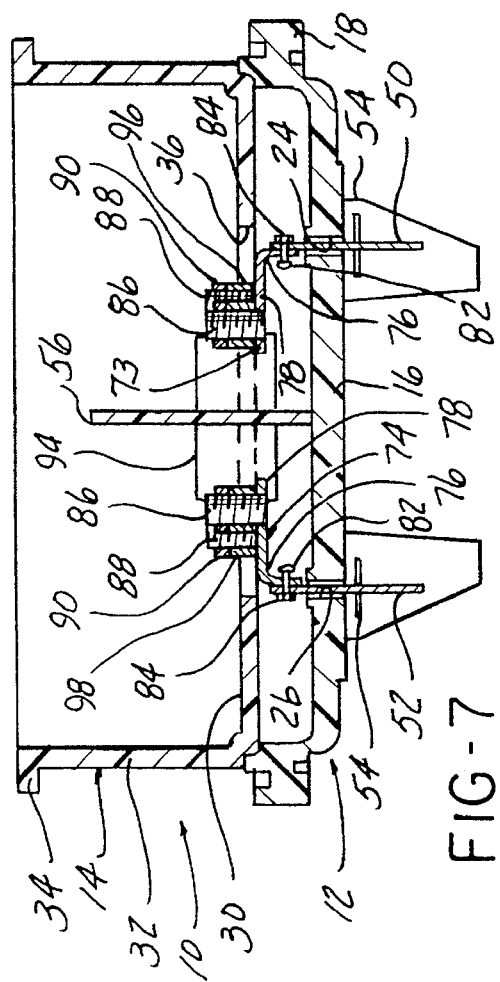
FIG. 7 is a cross-sectional view generally taken along line 7—7 in FIG. 4.
Figure 5:
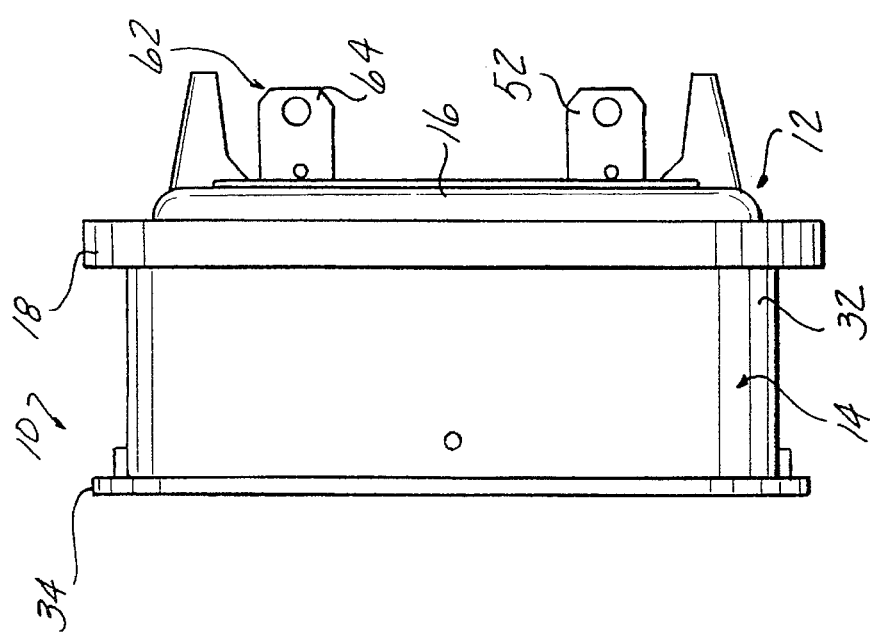
FIG. 5 is a right hand side elevational view of the adapter shown in FIG. 4.

The storage adapter 10 is formed of a housing which includes a base 12 as shown in FIGS. 5, 6 and 7 and a shell or watthour meter receiving portion denoted generally by reference number 14.

The base 12 is formed of a generally planar, central portion 16 which terminates in a raised, enlarged peripheral mounting rim 18. A first pair of apertures 20 and 22 are formed in the central portion 16 of the base 12 at the standard line terminal mounting position. A second pair of apertures 24 and 26 are also formed in the central portion 16 of the base 12, spaced from the first pair of apertures 20 and 22, and located at the standard load terminal mounting positions.

The shell 14 includes a bottom wall 30 having a generally planar configuration. An annular sidewall 32 extends from the bottom wall 30 and terminates in an outer, peripheral mounting flange 34 which engages a correspondingly formed mounting flange on a watthour meter, not shown.

The bottom wall 30 of the shell 14 is spaced from the central portion 16 of the base 12 to form a shallow cavity therebetween as shown in FIGS. 6 and 7. A generally centrally located aperture 36 is formed in the bottom wall 30 and opens to the cavity formed between the bottom wall 30 and the central portion 16 of the base 12.

Figure 4:
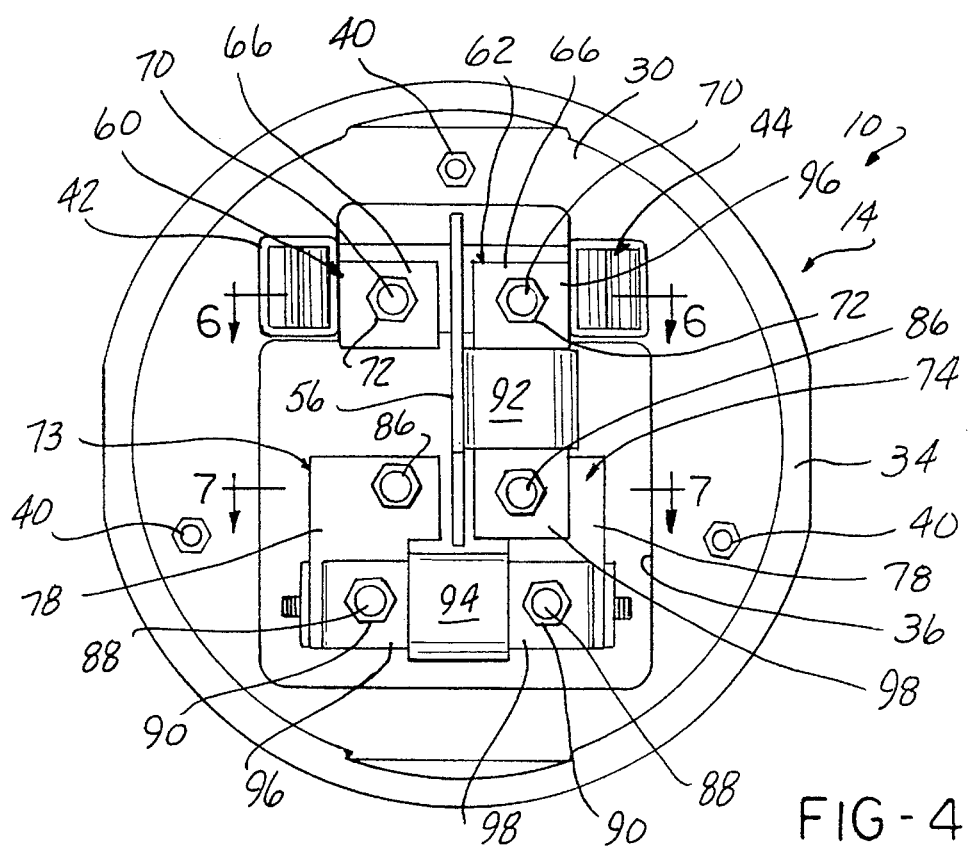
FIG. 4 is a front elevational view of a fused watthour meter bypass storage adapter constructed in accordance with the teachings of the present invention.

Suitable fasteners denoted by reference number 40 in FIG. 4 are employed to securely connect the shell 14 to the base 12 in a conventional manner.

According to the present invention, and as shown in FIGS. 4 and 6, a pair of line jaw contacts consisting of a conventionally constructed first jaw contact 42 and a second jaw contact 44 are mounted on raised bosses formed on the bottom wall 30 of the shell 14 at standard line jaw contact mounting positions by means of suitable fasteners 46 as is conventional. The jaw contacts 42 and 44 provide a temporary storage position for a watthour meter removed from the meter socket while the adapter 10 is in use.

As shown in FIG. 7, a pair of load blade terminals 50 and 52 are mounted at standard load blade terminal mounting positions and extend through the apertures 24 and 26, respectively, in the central portion 16 of the base 12 and terminate in an end disposed within the cavity between the central portion 16 of the base 12 and the bottom wall 30 of the shell 14. Each of the load blade terminals 50 and 52 is retained in position by means of a conventional fastener, such as a cotter pin 54.

An insulator plate 56, shown in FIGS. 4, 6 and 7 is mounted on the central portion 16 of the base 12 and extends through the aperture 36 in the bottom wall 30 of the shell 14 between the jaw contacts 42 and 44.

According to the present invention, the adapter 10 includes a first fuse connector means formed of separate members 60 and 62. Each of the members 60 and 62 is preferably in the form of an integral, one piece strip-like member formed of an electrically conductive material. Each member 60 and 62 has an L-shape formed of a first leg 64 and a perpendicularly disposed second leg 66. The first leg 64 is formed as a blade terminal and extends through one of the apertures 20 and 22 in the central portion 16 of the base 12 as shown in FIG. 6. The second legs 66 extend perpendicularly from the first leg 64 and are disposed in the cavity between the central portion 16 of the base 12 and the bottom wall 30 of the shell 14. Each second leg 66 are generally located within the confines of the aperture 36 and the bottom wall 30 of the shell 14. The conventional fastener, such as a cotter pin 54, is extendable through an aperture formed in the first end 64 of each member 60 and 62 to secure each member 60 and 62 in position on the base 12. A stub 67 is formed on each first leg 62 and engages an interior portion of the base 12 for positioning each member 60 and 62 relative to the base 12.

The second leg 66 of each member 60 and 62 acts as a fuse mounting support. A fuse mounting means in the form of a threaded stud 70, by way of example only, is press fit into an aperture in each second leg 66 and extends outward therefrom through the aperture 36 in the bottom wall 30 of the shell 14. The threaded stud 70 receives a threaded nut 72 to secure one end of a fuse on the member 60 or 62 as described in greater detail hereafter.

A second fuse connector means formed of a pair of fused connector members 73 and 74, shown in FIGS. 4 and 7, are also mounted on the base 12. Each of the members 73 and 74 has an identical, substantially L-shape formed of a short first leg 76 and an elongated second leg 78 which extends perpendicular to the first leg 76. An aperture 80, shown in FIG. 8, is formed in each first leg 76 and receives a suitable fastener in the form of a bolt 82 and nut 84 for securing the first leg 76 to one of the blade terminals, such as blade terminal 50 or 52.

Although the members 73 and 74 are described as being separate from the blade terminals 50 and 52 to each is connected, it will be understood that the present invention also contemplates the formation of each member 73 and 74 as an integral, one piece part of the respective blade terminal 50 or 52.

The second leg 78 of each member 73 and 74 acts as a fuse mounting support. Fuse mounting means, preferably in the form of threaded studs are mounted on the second leg 78 of each member 73 and 74. As shown in FIGS. 4, 7 and 8, two studs 86 and 88 are press fit into apertures on each second leg 78 and extend outward therefrom. Each stud 86 and 88 receives one end of a fuse and a suitable fastening nut 90 to securely mount the fuse on the members 73 and 74 as described hereafter.

Figure 8:
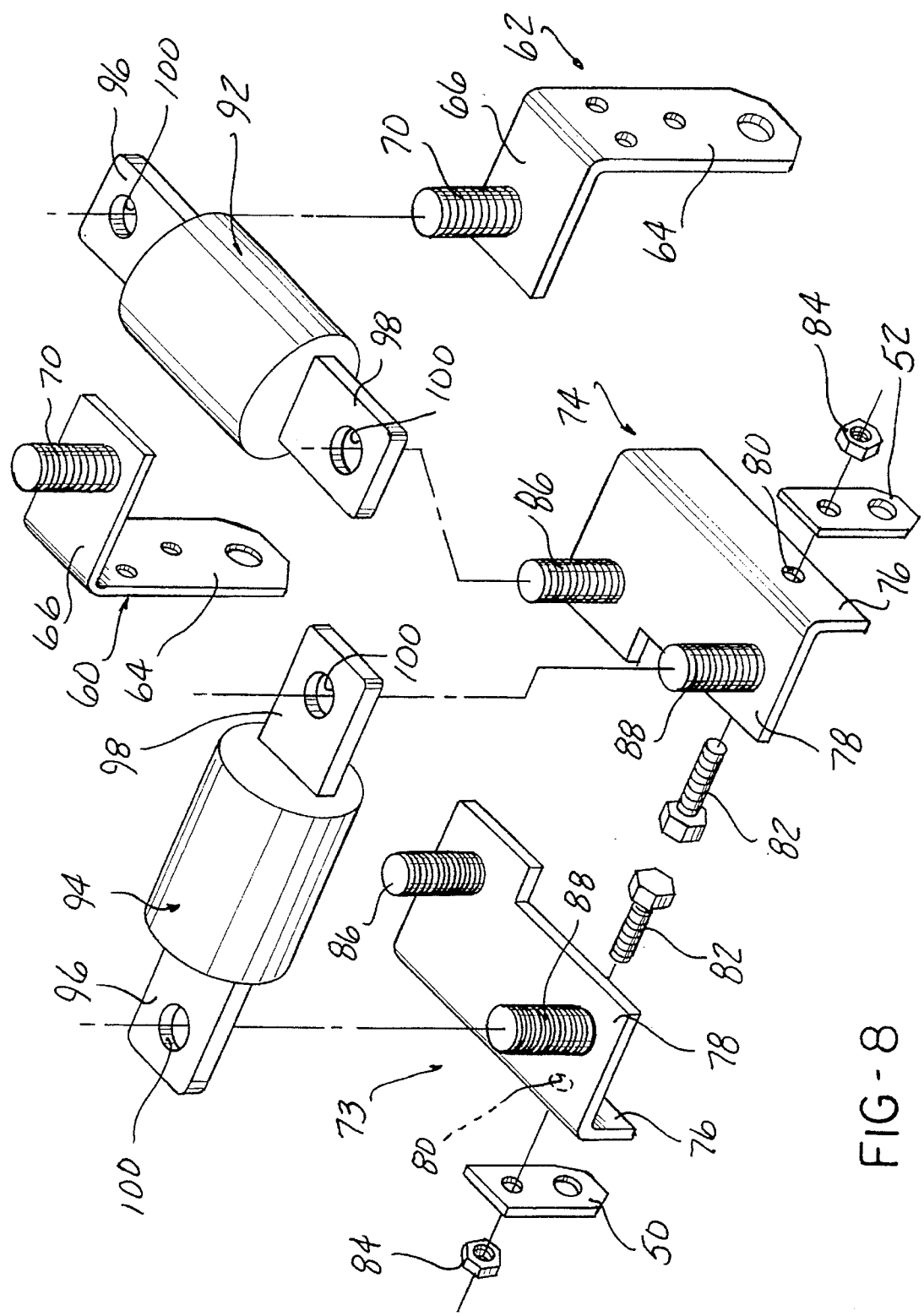
FIG. 8 is an exploded, perspective view showing the fuse connector means and the fuses employed in the socket adapter shown in FIG. 4.

The bypass adapter 10 of the present invention is designed to uniquely receive high amperage fuses, such as 110 amp Class T fuses, with two fuses 92 and 94 shown by way of example only in FIGS. 4 and 8. The fuses 92 and 94 are identically constructed and include a central cylindrical body with two outwardly extending end tabs 96 and 98. An aperture 100 is formed in each end tab 96 and 98 for mounting the fuses 92 and 94 over the respective threaded studs 70, 86 and 88 on the first and second fuse connector means as described hereafter.

As shown in FIGS. 4 and 8, the first and second fuse connector means including members 60, 62, 73 and 74 are mounted a specific dimensional relationship in the housing of the adapter 10 so as to space the respective threaded studs 70 and 86 as well as the studs 88 a specific distance apart so as to receive the apertures 100 on a fuse 92 or 94 thereon.

The illustrated arrangement of the first and second connector means of the present invention provides three fuse mounting positions within the adapter 10, with two fuses 92 and 94 being shown in FIGS. 4 and 8 by example only. It will be understood that a third fuse may also be mounted between the studs 70 and 86 on the first connector means 60 and the second connector means 73.

This arrangement enables two fuses 92 and 94 to be mounted within the adapter 10 on the respective first and second connector means to provide a bypass electrical power path between one of the line blade terminals 64 on the first connector means 60 or 62 and one of the second connector means 73 or 74. Specifically, a fuse, such as fuse 92, may be mounted on the first connector member 62 and connected to the second connector member 74 to provide an electrical path between the line blade terminal end 64 and the load blade terminal 52. A similar fuse, not shown, may be mounted between the first connector member 60 and the second connector member 73 attached to the other load blade terminal 50. Similarly, the fuse 94 may be mounted between the studs 88 on the second connector members 73 and 74 to provide an electrical connection between the load blade terminals 50 and 52 as shown in FIGS. 4 and 8. In this manner, if one of the line contacts in a meter socket is inoperative for any reason, a fuse 92 may be mounted in the adapter 10 to provide an electrical bypass connection between the opposite line contact and one or both of the load blade terminals 50 and 52 if an additional fuse 94 is also employed between the second connector members 73 and 74 as shown in FIGS. 4 and 8.

In summary, there has been disclosed a unique fused watthour meter bypass storage adapter which provides temporary electrical power to one or both load sides of an electrical power service while bypassing the watthour meter in the event of the inoperability of one of the line contacts in a watthour meter socket. The adapter of the present invention is designed to utilize high amperage fuses for safety and higher load current capability as well as providing a bypass jumper path between selected line and load terminals within the adapter and meter sockets. The present adapter also uniquely provides a means for storing a watthour meter on the adapter during the use of the adapter in providing temporary, unmetered power to a load distribution network. This eliminates the need to recalibrate the watthour meter when it becomes possible to reinstall the watthour meter in the meter socket.

What is claimed is:

1. A watthour meter bypass storage adapter mountable in jaw contacts in a watthour meter socket for connecting a watthour meter mountable in the adapter to at least certain of line and load conductors connected to the jaw contacts in the watthour meter socket, the adapter comprising:

a housing including a base and a watthour meter receiving portion;

a first pair of aperture formed in the base at standard line terminal mounting positions;

a second pair of apertures formed in the base at standard load terminal mounting positions;

a pair of load blade terminals extendable through the second pair of apertures in the base;

at least one line terminal mounted in one aperture of the first pair of apertures in the base and having a blade terminal end extending through the one aperture;

at least one fuse having opposite ends;

first fuse connector means, disposed in the housing, for connecting one end of the at least one fuse to the at least one line terminal, the first fuse connector means including a pair of first electrically conductive members, each having a blade terminal end and a fuse mounting surface angularly disposed from the blade terminal end, the blade terminal ends of the pair of first members extending through the first pair of apertures in the base;

second fuse connector means, disposed in the housing and having a portion attachable to each of the load blade terminals for mounting one end of the at least one fuse to at least one of the pair of load blade terminals, the second fuse connector means including a pair of second electrically conductive members, each having first and second angularly disposed legs, the first leg attachable to one of the load blade terminals, the second leg forming a fuse mounting surface; and wherein the at least one fuse is mountable in one of a plurality of selectible positions in the first and second fuse connector means including a first position between the at least one line terminal to one load blade terminal, and a second position between the two load blade terminals.

2. The adapter of claim 1 wherein the fuse mounting surface and the blade terminal end of the first member are integrally formed with the blade terminal end of the at least one line terminal as a one piece, unitary, electrically conductive member.

3. The adapter of claim 1 wherein:

the blade terminal end and the fuse mounting surface are disposed substantially 90° apart.

4. The adapter of claim 1 wherein the second fuse connector means further comprises:

fastener means, mounted on the second leg, for securing one end of the at least one fuse thereon.

5. The adapter of claim 4 further comprising:

apertures formed in the first leg and on each load blade terminal, a fastener extendible through the apertures to attach the first leg to the one load blade terminal.

6. The adapter of claim 1 wherein the first and second fuse connector means further comprise:

fastener means for securing one end of one fuse to the first and second fuse connector means, the fastener means including a threaded stud mounted on and extending outward from the fuse mounting surface of each first and second fuse connector means, and a fastener threadingly engaged with the threaded stud.

7. The adapter of claim 6 wherein:

the threaded studs on the first and second fuse connector means are spaced apart by a distance equal to a distance between apertures formed on the opposed ends of the at least one fuse.

8. The adapter of claim 6 wherein:

two threaded studs are mounted on the second fuse connector means;

the two studs being spaced apart on the second fuse connector means to selectively receive one end of a fuse mounted at an opposed end in the first fuse connector means, and one end of a fuse mounted on the second fuse connector means.

9. The adapter of claim 1 further comprising:

a pair of jaw contacts mounted in the housing in standard line terminal mounting positions for each receiving a blade terminal of a watthour meter therein;

the jaw contacts being disconnected from the at least one terminal extending through base of the housing.

10. The adapter of claim 1 wherein the watthour meter receiving portion of the housing comprises:

an annular sidewall extending from a planar bottom wall to a watthour meter mounting flange; and an aperture formed in the bottom wall, the first and second fuse connector means extending through the aperture in the bottom wall.

11. The adapter of claim 10 wherein:

a pair of jaw contacts are mounted on the bottom wall at standard line terminal mounting positions.

12. The adapter of claim 11 wherein:

the base includes a central portion spaced from the bottom wall to define a cavity therebetween, the cavity opening to the aperture in the bottom wall.

13. The adapter of claim 1 wherein:

one line terminal is disposed in each of the first pair of apertures in the housing;

the at least one fuse includes two fuses selectively mountable between the first and second fuse connector means to form connections between one line blade terminal and one load blade terminal, another line blade terminal and the other load blade terminal, and between the two load blade terminals.

14. A watthour meter bypass storage adapter mountable in jaw contacts in a watthour meter socket for connecting a watthour meter mountable in the socket adapter to at least certain of line and load conductors connected to the jaw contacts in the watthour meter socket, the adapter comprising:

a housing including a base and a watthour meter receiving shell having a planar bottom wall spaced from the base and an annular sidewall extending from the bottom wall and terminating in a watthour meter mounting flange;

a first pair of apertures formed in the base at standard line terminal mounting positions;

a second pair of apertures formed in the base at standard load terminal mounting positions;

a pair of line blade terminals extendable through the first pair of apertures in the base;

a pair of load blade terminals mounted in the second pair of apertures in the base and having a blade terminal end extending through the aperture in the base;

a pair of jaw contacts mounted on the bottom wall of the shell at standard line terminal contact mounting positions for receiving the blade terminals of a watthour meter therein, the pair of jaw contacts disconnected from the pair of line terminals;

at least one fuse having opposed ends;

first fuse connector means, disposed in the housing, for connecting the at least one fuse to one of the pair of line terminals;

second fuse connector means, disposed in the housing and having a portion attachable to each of the pair of load blade terminals; and wherein the at least one fuse is mountable in one of a plurality of selectible positions on the fuse mounting surfaces of the first and second fuse connector means to connect one line blade terminal to one load blade terminal, to connect the other line blade terminal to the other load blade terminal, and to connect the two load blade terminals together.

15. The adapter of claim 14 wherein the first fuse connector means comprises:

a pair of first electrically conductive members having a blade terminal end and a fuse mounting surface angularly disposed from the blade terminal end, the blade terminal ends of the pair of first members extending through the first pair of apertures in the base.

16. The adapter of claim 15 wherein:

the blade terminal end and the fuse mounting surface are disposed substantially 90° apart.

17. The adapter of claim 14 wherein the second fuse connector means comprises:

a pair of second electrically conductive members having first and second angularly disposed legs, the first leg attachable to one of the load blade terminals, the second leg forming a fuse mounting surface.

18. The adapter of claim 14 wherein the second fuse connector means further comprises:

fastener means, mounted on the second leg, for securing one end of one fuse thereon.

19. The adapter of claim 14 wherein the first and second fuse connector means further comprise:

fastener means for securing one end of one fuse to the first and second fuse connector means, the fastener means including a threaded stud mounted on and extending outward from the fuse mounting surface of each first and second fuse connector means, and a fastener threadingly engaged with the threaded stud.

20. The adapter of claim 19 wherein:

the threaded studs on the first and second fuse connector means are spaced apart by a distance equal to a distance between apertures formed on the opposed ends of the fuse.

21. The adapter of claim 19 wherein:

two threaded studs are mounted on the second fuse connector means;

the two threaded studs being spaced apart on the second fuse connector means to selectively receive one end of a fuse mounted at an opposed end to the first fuse connector means, and one end of a fuse mounted on the second fuse connector means.

* * * * *